US012713566B2

(12) United States Patent
Savin et al.

(10) Patent No.: US 12,713,566 B2
(45) Date of Patent: Aug. 18, 2026

(54) ELECTRONIC CONTROL UNIT

(71) Applicant: Veoneer Sweden Safety Systems AB, Stockholm (SE)

(72) Inventors: Anatolie Savin, Iasi (RO); Adrian Cacu, Iasi (RO)

(73) Assignee: VEONEER SWEDEN SAFETY SYSTEMS AB, Stockholm (SE)

( * ) Notice: Subject to any disclaimer, the term of this patent is extended or adjusted under 35 U.S.C. 154(b) by 522 days.

(21) Appl. No.: 18/030,626

(22) PCT Filed: Sep. 21, 2021

(86) PCT No.: PCT/EP2021/075875
§ 371 (c)(1),
(2) Date: Apr. 6, 2023

(87) PCT Pub. No.: WO2022/073753
PCT Pub. Date: Apr. 14, 2022

(65) Prior Publication Data

US 2023/0371215 A1 Nov. 16, 2023

(30) Foreign Application Priority Data

Oct. 6, 2020 (EP) .................................... 20200273

(51) Int. Cl.

| | |
|---|---|
| ***H05K 7/20*** | (2006.01) |
| ***H05K 5/00*** | (2025.01) |
| ***H05K 5/02*** | (2006.01) |
| ***H05K 5/03*** | (2006.01) |
| ***H05K 5/13*** | (2025.01) |

(52) U.S. Cl.
CPC ....... *H05K 7/20845* (2013.01); *H05K 5/0065* (2013.01); *H05K 5/0217* (2013.01); *H05K 5/03* (2013.01); *H05K 5/13* (2025.01)

(58) Field of Classification Search
CPC ......................... H05K 7/20845; H05K 5/0043
See application file for complete search history.

(56) References Cited

U.S. PATENT DOCUMENTS

| | | | | |
|---|---|---|---|---|
| 2009/0057006 A1* | 3/2009 | Kishibata | H05K 3/284 | 29/841 |
| 2013/0119908 A1* | 5/2013 | Harada | B62D 5/0406 | 318/400.42 |

(Continued)

FOREIGN PATENT DOCUMENTS

| | | |
|---|---|---|
| CN | 207282326 U | 4/2018 |
| CN | 207818380 U | 9/2018 |

(Continued)

OTHER PUBLICATIONS

Search Report and Written Opinion of the International Search Authority regarding corresponding PCT App. No. PCT/ EP2021/ 075875, mailed Dec. 21, 2021.

*Primary Examiner* — Imani N Hayman
(74) *Attorney, Agent, or Firm* — Dority & Manning, P.A.

(57) ABSTRACT

An electronic control unit for a vehicle. The electronic control unit is defined by a housing comprising a cover, a base, a circuit board, a connector and a backup power supply, and means for mounting the cover to the base. A carrier is provided for supporting the backup power supply. The carrier is arranged inside the housing and mounted directly to the base.

10 Claims, 2 Drawing Sheets

(56) References Cited

U.S. PATENT DOCUMENTS

| | | | |
|---|---|---|---|
| 2015/0047887 | A1 | 2/2015 | Lee et al. |
| 2017/0352495 | A1 | 12/2017 | Sato |

FOREIGN PATENT DOCUMENTS

| | | | |
|---|---|---|---|
| EP | 1883282 | A2 | 1/2008 |
| EP | 2955790 | A1 | 12/2015 |
| FR | 2746736 | A1 | 10/1997 |
| WO | 2010059977 | A2 | 5/2010 |
| WO | 2019005616 | A1 | 1/2019 |

* cited by examiner

ELECTRONIC CONTROL UNIT

CROSS-REFERENCE TO RELATED APPLICATIONS

This application is a 35 U.S.C. § 371 national phase of PCT International Application No. PCT/EP2021/075875, filed Sep. 21, 2021, which claims the benefit of priority under 35 U.S.C. § 119 to European Patent Application No. 20200273.9, filed Oct. 6, 2020, the contents of which are incorporated herein by reference in its entirety.

FIELD OF THE INVENTION

The invention relates to an electronic control unit for a vehicle. The electronic control unit is defined by a housing and comprises a cover, a base, a circuit board, a connector and a backup power supply, and means for mounting the cover to the base.

DESCRIPTION OF THE BACKGROUND ART

International patent application WO 2019/005616 A1 is directed to a surface mount coupling capacitor and a circuit board containing a surface mount coupling capacitor. The coupling capacitor includes a main body containing at least two sets of alternating dielectric layers and internal electrode layers. The coupling capacitor includes external terminals electrically connected to the internal electrode layers wherein the external terminals are formed on a top surface of the coupling capacitor and a bottom surface of the coupling capacitor opposing the top surface of the coupling capacitor.

International patent application WO 2010/059977 A2 discloses a solderless capacitor mount assembly including a cover having a base portion and a cover portion. The cover portion and base portion are couplable to each other so as to secure a capacitor to the cover. The assembly further includes at least one connector configured to couple the assembly to a printed circuit board, and at least one electrical contact configured to contact a respective at least one lead of the capacitor and provide an electrical connection for the capacitor.

US patent application US 2015/047887 A1 discloses a mounting circuit board of a multilayer ceramic capacitor. First and second internal electrodes are alternately exposed to both end surfaces of the ceramic body. The first and second external electrodes extend from both end surfaces of the ceramic body to a portion of a lower surface thereof. A printed circuit board has first and second electrode pads so that the first and second external electrodes are mounted thereon.

Chinese utility model CN 207818380 U discloses an electrolytic capacitor mount.

Chinese utility model CN 207282326 U relates to a specific super capacitor module group. A super capacitor module has a shell and an upper cover. The upper cover is connected to the shell, anode and cathode connection of the super capacitor module. The super capacitor module includes U shaped steel, circuit board and a plurality of super capacitors. The supercapacitor unit is fixed in on the circuit board and the circuit board is fixed in the recess of U-shaped steel.

As known, an electrical control unit (ECU) is an embedded electronic device, basically a digital computer, that controls one or more electrical systems (or electrical sub systems) of a vehicle based on e.g. information read from sensors placed at various parts and in different components of the vehicle. It is therefore necessary, to make sure, that the ECU is provided with power even in cases where the main power supply may have a malfunction. Therefore, a backup power supply is provided which often is a relatively heavy capacitor. The capacitor often is fixed on the printed circuit board (PCB) or to the connector. The problem with fixing the backup power supply to the PCB is that the mass of the backup power supply is adding stress to the PCB, which might hurt the PCB. Fixing the power supply to the connector often causes undesired vibration noise.

SUMMARY OF THE INVENTION

It is an object of the present invention to provide an electronic control unit and a method of assembling the electronic control unit for a vehicle comprising a backup power supply where the backup power supply has a reduced negative impact on the electronic control unit.

The above object is achieved by an electronic control unit for a vehicle comprising the features of claim 1. With respect to the method of assembling the electronic control unit the object is achieved by a method comprising the features of claim 10.

According to an embodiment of the invention an electronic control unit for a vehicle is provided, wherein the electronic control unit is defined by a housing comprising a cover, a base, a circuit board, a connector, and a backup power supply and means for mounting the cover to the base. A carrier for supporting the backup power supply is provided. The carrier is arranged inside the housing and mounted directly to the base.

The advantage of the present invention is that the backup power supply can be applied to the ECU causing hardly any additional vibrations. A negative impact on components of the ECU can be avoided.

According to an embodiment of invention, the base is made of a metallic material, especially of cast aluminium and the carrier is made of a nonconductive material, especially plastics. Thus, the carrier can be produced at low cost and in a variety of shapes, e.g. with injection moulding.

According to an embodiment of the invention, the carrier is mounted between the base and the circuit board.

According another embodiment of the invention, the carrier is fixed directly on the base by screws.

According to a further embodiment of the invention, the base forms a cavity and the carrier comprises a carrier base and carrier arms extending substantially vertically from the carrier base. In embodiment openings may be provided at the end of the carrier arms for mounting the carrier directly to the base. The carrier arms may also be directly connected to the circuit board on the far side of the base.

According to a further embodiment of the invention, the cover, the circuit board and the carrier have mounting openings and the base has mounting bores. The mounting openings of the cover, the circuit board and the carrier are aligned with the mounting bores of the base. Screws connect the cover, the circuit board, the carrier and the base and thereby defining a sandwich structure.

According to an embodiment of the method of assembling the electronic control unit for a vehicle the following steps are performed:—providing the base,—providing the carrier onto the base, the carrier, where the base supports a power supply,—providing the circuit board and the connector electrically connected to mounted on the carrier side of the circuit board onto the carrier,—providing the cover onto the circuit board, and—aligning mounting openings of the cover, the circuit board and the carrier with mounting openings of the base and connecting the cover, the circuit board and the carrier with the base via screws.

BRIEF DESCRIPTION OF THE DRAWINGS

The numerous advantages of the disclosure may be better understood by those skilled in the art by reference to the accompanying figures in which.

DETAILED DESCRIPTION

Figure 1:
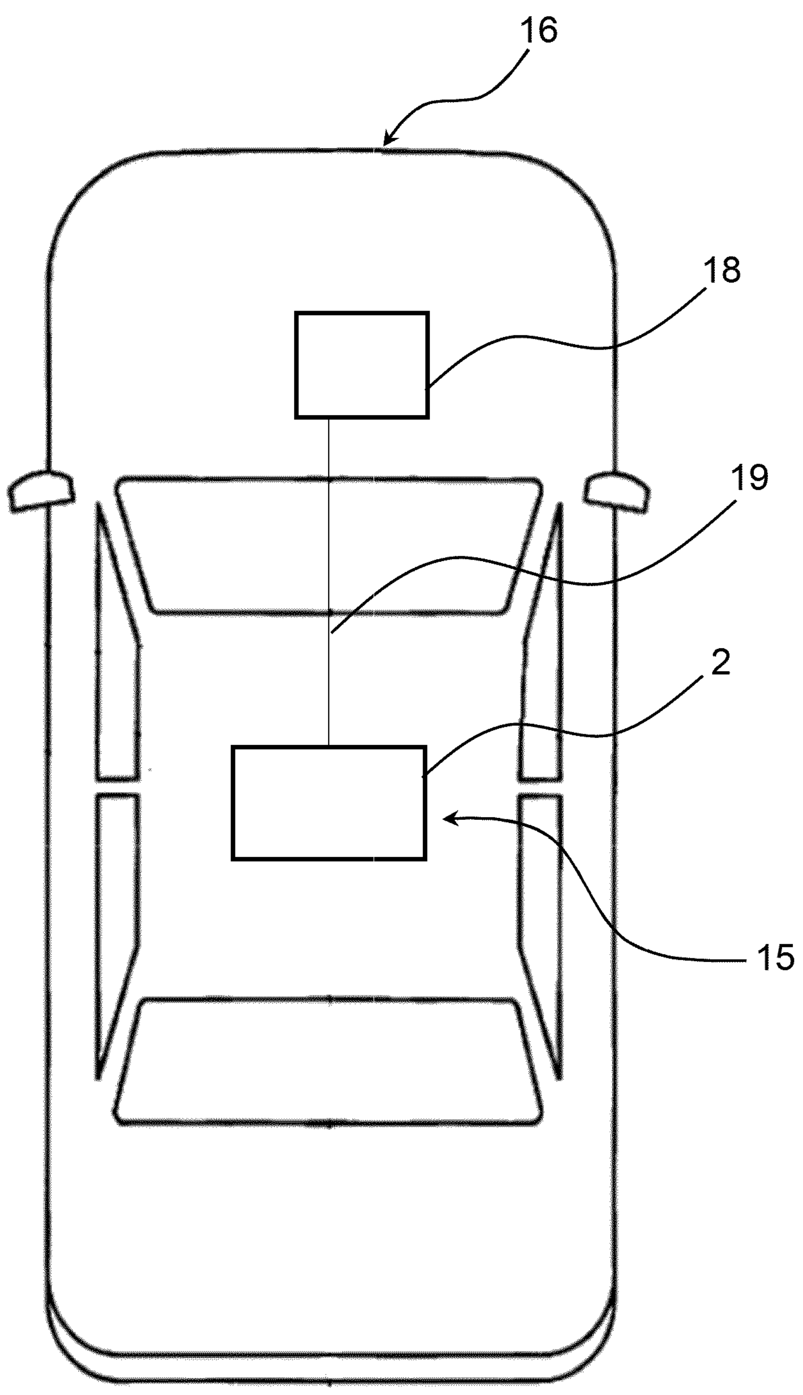
FIG. 1 shows schematic representation of the placement of an electronic control unit for a vehicle.

Same reference numerals refer to same elements or elements of similar function throughout the various figures. Furthermore, only reference numerals necessary for the description of the respective figure are shown in the figures. The shown embodiments represent only examples of how the invention can be carried out. This should not be regarded as a limitation of the invention.

FIG. 1 shows schematic representation of the placement of an electronic control unit (ECU) 15 for a vehicle 16. The electronic control unit 15 controlling one or more electrical systems of the vehicle 16 comprises a housing 2. For cost saving, the housing may be made from plastics. In cases, where the vibration during the use vehicle 16 are more extreme the housing 2 can be made from metallic materials, such as die cast aluminium. To supply the ECU 15 with electrical power it is electrically connected with a vehicle battery 18, typically with an electric line 19.

Figures 2, 3:
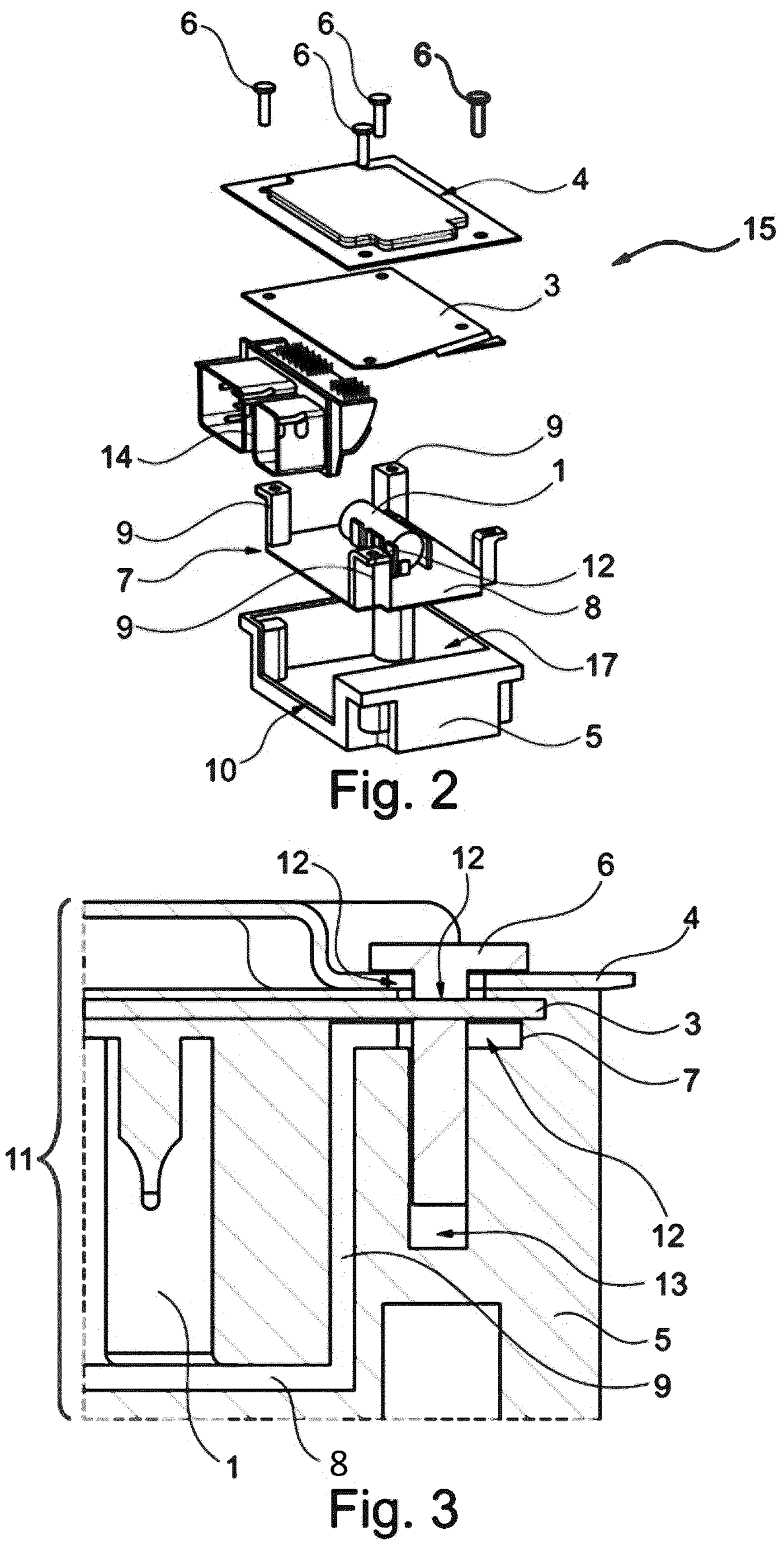
FIG. 2 is a perspective and exploded view of the electronic control unit for a vehicle according an embodiment of the invention.
FIG. 3 is a cross-sectional view of an electronic control unit for a vehicle according an embodiment of the invention.

FIG. 2 is a perspective and exploded view of the ECU 15 for a vehicle 16 according an embodiment of the invention. The ECU 15 is defined by a housing 2 (FIG. 1). It comprises a cover 4 and base 5. In cases, where ECU 15 is subjected to stronger vibrations during the use of the vehicle 16 the cover 4 and the base 5 can be made from metallic materials such as die cast aluminium. A carrier 7 is arranged inside the housing 2 (FIG. 1) and can be mounted directly to the base 5. To make sure, that the ECU 15 is provided with power, even in cases where the main vehicle battery 18, or the electric line 19 may have a malfunction, a backup power supply 1 is provided. The backup power supply 1 can be a capacitor having sufficient capacity to provide the necessary backup power. The backup power supply 1 is fixed to the carrier 7 by fixing means (not shown), e.g. by a cradle.

Furthermore, a printed circuit board 3 (PCB) and a connector 14, is provided. The connector 14, is electrically connected to the circuit board 3. Means for mounting the cover 4 to base 5 are provided also. Preferably this means are screws 6. This embodiment has the advantage, that the backup power supply 1 can be provided in the housing 2 with low complexity thereby avoiding stress to the PCB or undesired vibration noise.

In an embodiment of the invention the carrier 7 is made of a nonconductive material, especially of plastics. This provides an electrical isolation to the base 5, in cases where the base 5 is made of a metallic material. Furthermore, when the carrier 7 is made from plastics it can be produced cost effective and in the desired shape, e.g. by injection molding.

In an embodiment of the invention the base 5 forms a cavity 17. The advantage of this embodiment is that the cavity 17 gives enough space for the backup power supply 1 to be placed. In this case the carrier 7 comprises a carrier base 8 and carrier arms 9 extending substantially vertically from the carrier base 8. This allows to mount the backup power supply 1 to the carrier base 8, as the cavity 17 provides enough room for the backup power supply 1. The carrier 7 can be directly mounted to the base 8 by providing openings 12 in the carrier arms 9, where the screws 6 can pass through the openings 12 and cooperate with respective mounting bores 13 of the base 5.

Assembling the electronic control unit 15 comprises the steps of providing the base 5, providing the carrier 7 onto the base 5, where the carrier 7 supports a backup power supply 1. A circuit board 3 is provided and a connector 14 is electrically connected to the circuit board 3. A cover 4 is provided onto the circuit board 3 and the cover 4, the circuit board 3, the carrier 7 and the base 5 are connected to each other with screws 6.

FIG. 3 is a cross-sectional view of the assembled ECU 15 for a vehicle 16 according an embodiment of the invention. The carrier arm 9 for mounting the carrier 7 directly to the base 5 is directly connected to the circuit board 3 on the far side of the base 5. The cover 4, the circuit board 3, the carrier 7, and the base 5 are connected with screws 6 and define thereby a sandwich structure 11. In order to establish the sandwich structure 11 the cover 4, the circuit board 3 and the carrier 7 have mounting openings 12. The mounting openings 12 of the cover 4, the circuit board 3 and the carrier 7 and the mounting bores 13 of the base 5 are aligned which each other and connected with each other via screws 6. The backup power supply 1 is provided on the carrier base 8.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

The invention claimed is:

1. An electronic control unit for a vehicle, comprising:

a housing formed by a cover, a base, and a connector, wherein a circuit board is electrically connected to the connector, wherein the base defines a cavity; and a backup power supply supported on a carrier, wherein the carrier is arranged inside the cavity of the base of the housing and between the base and the circuit board, wherein the cover, the circuit board, the carrier, and the base each define a plurality of mounting openings, with corresponding openings of the plurality of mounting openings being aligned for receiving a mechanical fastener therethrough for securing together each of the cover, the circuit board, the carrier, and the base.

2. The electronic control unit for a vehicle according to claim 1, wherein the base is made of a metallic material, and the carrier is made of a nonconductive material.

3. The electronic control unit for a vehicle as claimed in claim 1, wherein the carrier is made of a plastic material.

4. The electronic control unit for a vehicle as claimed in claim 1, wherein the carrier is fixed directly on the base by the mechanical fastener.

5. The electronic control unit for a vehicle as claimed in claim 1, wherein the carrier comprises a carrier base and carrier arms extending substantially vertically from the carrier base.

6. The electronic control unit for a vehicle as claimed in claim 5, further including mounting openings disposed in corresponding ends of the carrier arms for mounting the carrier directly to the base.

7. The electronic control unit for a vehicle as claimed in claim 6, wherein the carrier arms are directly connected to the circuit board, with the carrier located between the circuit board and the base.

8. The electronic control unit for a vehicle as claimed in claim 1, wherein the mechanical fastener is one of a plurality of mechanical fasteners, wherein the cover, the circuit board and the carrier each have mounting openings and the base has mounting bores, wherein the mounting openings of the cover, the circuit board, and the carrier, and the mounting bores of the base are aligned which each other and connected with each other via the plurality of mechanical fasteners to form a sandwich structure.

9. The electronic control unit for a vehicle as claimed in claim 1, wherein the mechanical fastener includes a screw.

10. A method for assembling an electronic control unit for a vehicle wherein the electronic control unit includes: a housing having a cover, a base, a circuit board, a connector, a backup power supply, and screws for mounting the cover to the base; and a carrier arranged inside the housing and mounted directly to the base, wherein the cover, the circuit board, the carrier, and the base each define a plurality of mounting openings, with corresponding openings of the plurality of mounting openings being aligned, the method comprising:

providing the base;

providing the carrier onto the base, the carrier supporting the backup power supply;

providing the circuit board;

electrically connecting the connector to the circuit board;

providing the cover onto the circuit board; and aligning the mounting openings of the cover, the circuit board, the carrier and the base and connecting the cover, the circuit board, the carrier and the base with screws, thereby securing together each of the cover, the circuit board, the carrier, and the base.

* * * * *